United States Patent [19]

Dasilva

[11] Patent Number: 4,654,610

[45] Date of Patent: Mar. 31, 1987

[54] PIN DIODE SWITCHED RF SIGNAL ATTENUATOR

[75] Inventor: Marcus K. Dasilva, Spokane, Wash.

[73] Assignee: Hewlett-Packard Company, Palo Alto, Calif.

[21] Appl. No.: 758,608

[22] Filed: Jul. 23, 1985

[51] Int. Cl.$^4$ .......................... H03H 7/24; H01P 1/22
[52] U.S. Cl. .................................. 333/81 R; 333/103; 323/354
[58] Field of Search .......................... 333/81 R, 81 A; 323/351, 354

[56]  References Cited
U.S. PATENT DOCUMENTS
4,138,637  2/1979  Weinert ................................ 323/354

OTHER PUBLICATIONS

Allen et al., *Programmable Attenuator*, Wireless World vol. 85, No 1524, Aug. 1979.
Harvey et al., *Linear Pin Diode Switched Attenuator*, Monitor (Australia)–Proc. IREE, Jan./Feb. 1976, vol. 37, No. 1, pp. 11,12.

Primary Examiner—Paul Gensler
Attorney, Agent, or Firm—Leslie G. Murray

[57]  ABSTRACT

A multi-path, ladder-type variable step RF signal attenuator is provided. The ladder network is comprised of a number of asymmetric power splitting elements and PI-pad resistor attenuator elements. The high-speed switching and long life characteristics of PIN diodes are utilized to switch resistive attenuator elements into or out of the ladder network to provide selectable values of signal attenuation.

8 Claims, 3 Drawing Figures

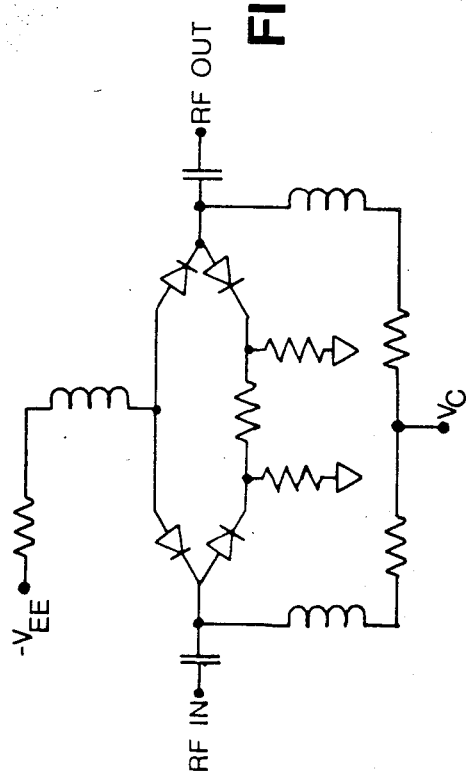
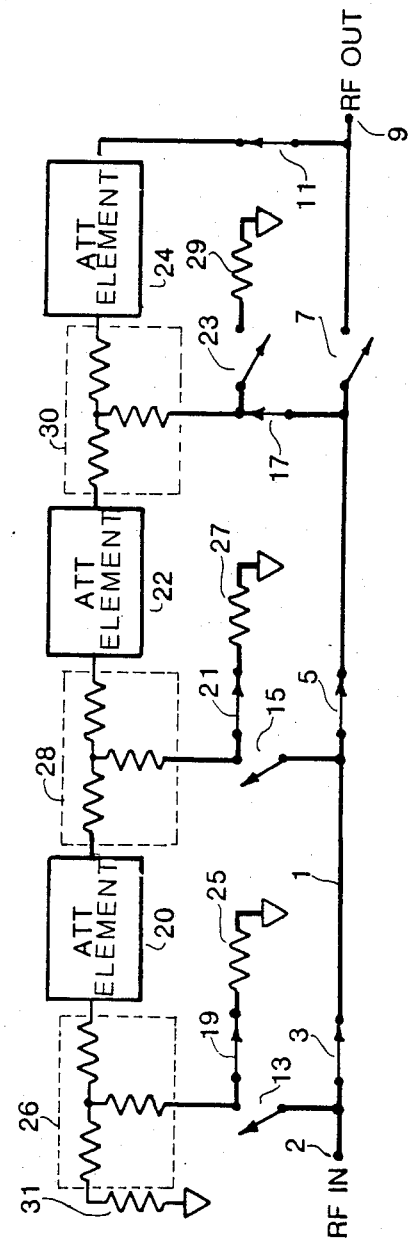
FIG 1 (PRIOR ART)
FIG 2

PIN DIODE SWITCHED RF SIGNAL ATTENUATOR

FIELD OF INVENTION

The present invention relates generally to a variable step RF attenuator and more particularly to an RF attenuator with a plurality of attenuating sections which can be cascaded with each other utilizing PIN diode switches.

BACKGROUND OF THE INVENTION

Switchable step attenuators which are intended to provide attenuation at selectively adjustable levels are well-known in the art. Typically, the prior art attenuator devices employ a series of attenuator sections designed to provide attenuation in discrete steps. The attenuator sections are switched into and out of the circuit by switches, either mechanical or electronic. The well-known "decade box" provides an example of a prior art variable attenuator device.

In RF applications, the attenuator requires broad bandwith, e.g., from DC to gigahertz range, and accuracy, ±0.1 dB, and the attenuator must be matched to a transmission line characteristic impedance. Typically, RF attenuators employ several T-attenuator or PI-attenuator sections or elements with switching elements to either select or bypass each attenuator section. Double pole, double throw mechanical switches, or relays, for example, are suitable for low-speed operation. High-speed applications may require rapid switching of attenuator sections for long periods of time. Because of the nature and construction of relays and other types of mechanical switches, such switches tend to wear out when utilized in high speed applications.

Electronic switches, such as a PIN diode, can be used to provide high speed switching of broadband RF signals. PIN diodes have low capacitance when in the OFF state and a low resistance in the ON state and can be switched by a current signal. U.S. Pat. No. 4,359,699 issued to Philip R. Horkin on Nov. 16, 1982 provides an example of PIN diodes used in the prior art to construct a linear attenuator.

Stepped attenuators comprised of several PI or T-pad attenuating elements switched into or out of a circuit utilizing PIN diodes are also known. An example of a prior art switched PI attenuator element is shown in FIG. 1. In the attenuator configuration shown FIG. 1, four PIN diodes and three RF chokes are required. Each attenuator element, when in the bypassed condition, has the insertion loss of two PIN diodes. As a result, PIN diode switched attenuators typically have higher insertion losses than mechanically switched stepped attenuators. The isolation provided by each PIN diode is limited which increases the number of PIN diodes required to provide good RF isolation which further increases the insertion loss. Additionally, as shown in FIG. 1, two control lines are required for each attenuator element.

SUMMARY OF THE INVENTION

In accordance with the principles of the present invention, a variable broadband RF signal attenuator is provided in which PIN diodes are utilized as switches to couple an RF signal to one of several inputs to a ladder-type variable attenuator. The ladder comprises a number of power splitter elements and attenuator elements alternately connected in series to form an attenuator network in which an input terminal of each power splitter element is connected as a selectable input to the attenuator network. The circuit is configured so that the input terminal of the non-selected power splitter elements is always terminated in the RF signal input transmission line characteristic impedance.

The use of PIN diodes provides a variable step attenuator which is all electronic with no mechanical switches or moving parts thereby providing improved reliability and taking advantage of the high-speed switching and long life characteristics of PIN diodes. The configuration requires fewer RF chokes than the prior art attenuator element shown in FIG. 1 and requires only one drive line per attenuator element thereby reducing costs and improving high frequency response. Further, by minimizing the number of through line PIN diodes required, insertion loss is reduced without any reduction in isolation.

BRIEF DESCRIPTION OF THE DRAWINGS

FIG. 1 illustrates a diode-switched attenuator element as used in the prior art.

FIG. 2 is a block diagram of a ladder-type variable stepped attenuator according to the principles of the present invention.

DESCRIPTION OF THE PREFERRED EMBODIMENT

Figure 3:
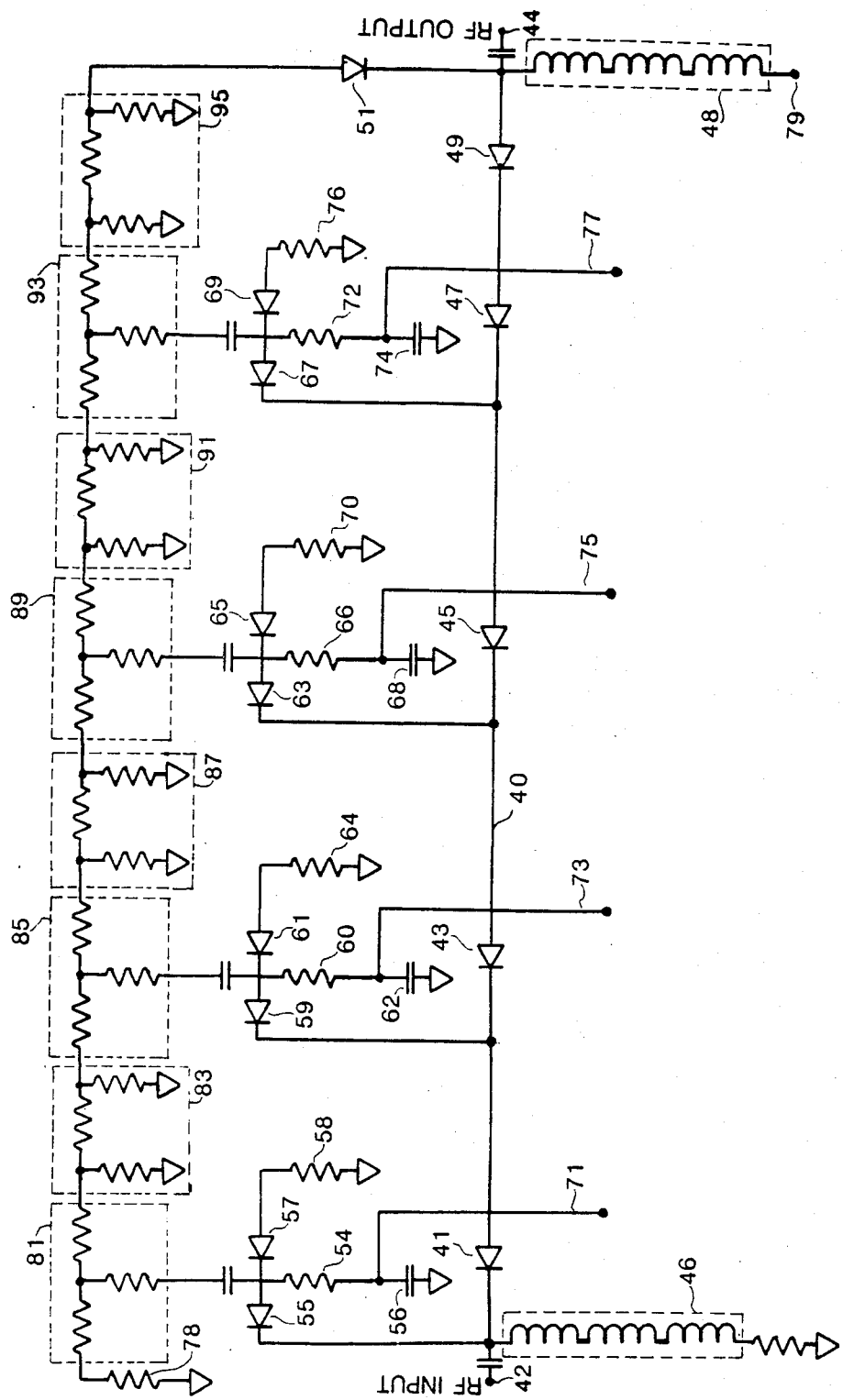
FIG. 3 is a schematic diagram of the variable stepped attenautor illustrated in FIG. 2.

Referring now to FIG. 2, a variable ladder-type step attenuator utilizing the switching characteristics of PIN diodes is provided. The attenuator is comprised of a through put line 1 having an RF input 2 and RF output 9 and an attenuator network formed by arranging power splitter elements 26, 28 and 30 and attenuator elements 20, 22 and 24 as shown. Each attenuator element 20, 22 and 24 will attenuate the signal by a predetermined amount, 10 dB for example. If switches 3, 5 and 7 are closed and switches 13, 15, 17 and 11 are open, then an RF signal input at RF input 2 is passed through on line 1 unattenuated (in the ideal case). If switches 3, 5, 17, 11, 19 and 21 are closed and switches 13, 15, 23 and 7 are open, the RF signal input at RF input 2 will be attenuated by the product of the power splitter element 30 attenuation and the attenuation of the attenuation element 24. Similarly, if switches 3, 15, 11, 19 and 23 are closed and switches 5, 7, 13, 21 and 17 are open, the RF signal attenuation will be the product of the attenuation of power splitter elements 28 and 30 and attenuation elements 22 and 24. If each power splitter element 26, 28, 30 is 6 dB and each attenuator element 20, 22, 24 is 4 dB, the entire attenuator network will provide 0–30 dB attenuation in 10 dB steps. Adding more elements to the attenuator network extends the attenuation range.

Referring now to FIG. 3, a schematic diagram of a 0–60 dB step attenuator providing attenuation settings of 0, 10, 30, 50, and 60 dB is shown. The step ladder attenuator is comprised of throughput line 40, power splitter elements 81, 85, 89 and 93 and attenuator elements 83, 87, 91 and 95. Attenuator elements 83, 87, 91 and 95 each comprise three resistors arranged as a PI attenuator element. PIN diodes operate as single-pole single-throw switches that are "on" when current flows through the diodes (forward biased) and "off" when reverse biased. In each case, only one bias or control line 71, 73, 75, 77 or 79 is required for each attenuator setting.

The number of RF chokes required to bias the PIN diodes is minimized by utilizing asymmetric power splitters 81, 85, 89 and 93 and resistors 54, 60, 66 and 72 to provide resistive biasing for the diodes. Resistors 58, 64, 70, 76 and 78 are the characteristic impedance of the transmission lines, 50 ohms for example. The values of the attenuation elements 83, 87, 91 and 95 are adjusted to compensate for the power splitter asymmetry. The power splitter elements are chosen so that all RF inputs and outputs are matched to the characteristic impedance, 50 ohms for example, at any setting of the attenuator. Capacitors 56, 62, 68 and 74 provide an AC ground to prevent RF feedthrough and minimizes crosstalk between the control lines 71, 73, 75 and 77. RF chokes 46 and 48 provide a high impedance to any RF signal thereby isolating the throughput line 40 from RF ground and the DC bias supply. RF chokes 46 and 48 are selected to minimize self-resonance effects over the bandwidth of the attenuator.

If line 79 is held high and control lines 71, 73, 75 and 77 are held low, PIN diodes 41, 43, 45, 47, 49, 57, 61, 65 and 69 are on and PIN diodes 55, 59, 63, 67 and 51 are off allowing the RF input signal at RF input 42 to pass through the attenuator on line 40 with no attenuation (other than the insertion losses of diodes 41, 43, 45, 47 and 49). If control line 77 is held high and the remaining lines 71, 73, 75 and 79 are held low, diodes 41, 43, 45, 67, 51, 57, 61 and 65 are on and diodes 47, 49, 55, 59, 63 and 69 are off. The attenuation of the RF input signal at the RF output 44 will be the product of the power splitter 93 attenuation and the attenuation network 95 attenuation. The unused RF inputs are terminated in the RF input 42 line characteristic impedance by resistors 58, 64 and 70 via diodes 57, 61 and 65, respectively. PIN diode 49 provides additional isolation when power splitter 93 and attenuator network 95 are the only attenuation elements in the ladder. Similarly, by holding a desired control line high and the remaining control lines low, any one of the available attenuation settings may be achieved.

I claim:

1. A ladder-type RF signal attenuator having selectable levels of signal attenuation comprising:
    an electrical conductor having an input terminal, an output terminal and a plurality of first electronic switch means connected in series fashion between said input terminal and said output terminal for providing a first RF signal path having minimum signal attenuation;
    an attenuation network having a plurality of RF input means and a single RF output, each of said plurality of RF input means selectively coupled to the electrical conductor, the RF output selectively coupled to the output terminal of the electrical conductor for providing a plurality of second RF signal paths, each of said second RF signal paths having a different predetermined level of signal attenuation, each of said plurality of first electronic switch means associated with a different one of said plurality of RF input means for selecting an associated one of said second RF signal paths;
    a plurality of second electronic switch means, each of said second switch means connected between the electrical conductor and a different one of said plurality of RF input means for coupling an RF signal to the attenuation network; and
    a plurality of control lines for providing a bias signal to said plurality of first and second switch means, said first and second electronic switch means responsive to said bias signal for selecting a desired one of said first and second RF signal paths.

2. The RF signal attenuator as in claim 1 wherein said first and second electronic switch means comprise diodes.

3. The RF signal attenuator as in claim 2 wherein said diodes comprise PIN diodes.

4. The RF signal attenuator as in claim 1 wherein said attenuation network comprises a plurality of attenuator elements coupled in series fashion, each of said attenuator elements having a predetermined signal attenuation, each of said plurality of RF input means associated with a different one of said attenuator elements.

5. The RF signal attenuator as in claim 4 wherein each of said RF input means comprise a resistive network forming a power splitter element, each of said power splitter elements interconnected between a different pair of said attenuator elements and one of said second electronic switch means.

6. The RF signal attenuator as in claim 5 wherein said attenuation network further comprises a plurality of third electronic switch means, each of said third switch means coupled to a different one of said RF input means, said third electronic switch means responsive to said bias signal for terminating said RF input means in a characteristic impedance when the associated second electronic switch means is in an open state.

7. The RF signal attenuator as in claims 6 wherein said first, second and third switch means comprise diodes.

8. The RF signal attenuator as in claim 7 wherein said diodes comprise PIN diodes.

* * * * *